US008410555B2

(12) United States Patent
Wang et al.

(10) Patent No.: US 8,410,555 B2
(45) Date of Patent: Apr. 2, 2013

(54) CMOSFET DEVICE WITH CONTROLLED THRESHOLD VOLTAGE AND METHOD OF FABRICATING THE SAME

(75) Inventors: Wenwu Wang, Beijing (CN); Huilong Zhu, Beijing (CN); Shijie Chen, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 316 days.

(21) Appl. No.: 12/937,444

(22) PCT Filed: Jun. 24, 2010

(86) PCT No.: PCT/CN2010/074387
§ 371 (c)(1),
(2), (4) Date: Oct. 12, 2010

(87) PCT Pub. No.: WO2010/149058
PCT Pub. Date: Dec. 29, 2010

(65) Prior Publication Data
US 2011/0169097 A1    Jul. 14, 2011

(30) Foreign Application Priority Data
Jun. 26, 2009    (CN) .......................... 2009 1 0087807

(51) Int. Cl.
H01L 27/12    (2006.01)
(52) U.S. Cl. ................. 257/350; 257/359; 257/E27.064; 257/E27.067; 257/E27.108
(58) Field of Classification Search .................. 257/350, 257/E27.62, E27.64–E27.67, E27.108, 359; 438/152, 309, 311
See application file for complete search history.

(56) References Cited

U.S. PATENT DOCUMENTS

| 2007/0148838 A1* | 6/2007 | Doris et al. .................... 438/197 |
| 2008/0150036 A1* | 6/2008 | Jung et al. ...................... 257/369 |
| 2010/0197128 A1* | 8/2010 | Schaeffer et al. ............. 438/591 |

FOREIGN PATENT DOCUMENTS

| CN | 1949532 | 4/2007 |
| CN | 1992273 | 7/2007 |
| WO | WO 2009/072421 | 11/2009 |

OTHER PUBLICATIONS

"Ultrathin high-K gate stacks for advanced CMOS devices" by E.P. Gusev et al. *IEEE*, 2001, pp. 451-454.
Search Report and Written Opinion from corresponding PCT application Serial No. PCT/CN2010/074387, dated Sep. 30, 2010.
1st Office Action issued from SIPO, China for related Chinese Application No. 200910087807.2; date Aug. 19, 2011, 4 pages.

* cited by examiner

*Primary Examiner* — Long Tran
(74) *Attorney, Agent, or Firm* — Westman, Champlin & Kelly, P.A.

(57) ABSTRACT

There is provided a CMOSFET device with a threshold voltage controlled by means of its gate stack configuration and a method of fabricating the same. The CMOSFET device comprises: a semiconductor substrate; am interface layer grown on the silicon substrate; a first high-k gate dielectric layer deposited on the interface layer; a very thin metal layer deposited on the first high-k gate dielectric layer; a second high-k gate dielectric layer deposited on the very thin metal layer; and a gate electrode layer deposited on the second high-k gate dielectric layer.

12 Claims, 3 Drawing Sheets

CMOSFET DEVICE WITH CONTROLLED THRESHOLD VOLTAGE AND METHOD OF FABRICATING THE SAME

CROSS-REFERENCE TO RELATED APPLICATION

This Application is a Section 371 National Stage Application of International Application No. PCT/CN2010/074387, filed Jun. 24, 2010, not yet published, the contents of which are hereby incorporated by reference in their entirety.

Substitute Specification filed herewith.

FIELD OF INVENTION

The present invention generally relates to the field of high-k gate dielectric and metal gate configuration in the nano-scale Complementary Metal-Oxide-Semiconductor (CMOS) technology, and in particular, to a Complementary Metal-Oxide-Semiconductor Field Effect Transistor (CMOSFET) device with a threshold voltage controlled by means of its gate stack configuration and a method of fabricating the same.

DESCRIPTION OF PRIOR ART

The application of the core technologies for Integrated Circuit (IC) processes at 22 nm and below is an inevitable trend of the development of ICs, and is one of the is projects that most of the semiconductor corporations and research institutes over the world compete to develop. CMOS device gate engineering with the "high-k gate dielectric/metal gate" as the core technology is the most representative key process for 22 nm and below technologies. Relevant materials, processes and configurations are now under wide research.

A CMOS device with a high-k gate dielectric/metal gate configuration has a leakage current smaller by at least 2 orders than a conventional one with a poly-silicon gate/SiO$_2$ configuration, and thus has a greatly reduced static power consumption. However, this brings an issue of threshold voltage controlling of the CMOS device. Since the CMOS process involves both N-type Metal Oxide Semiconductor (NMOS) and P-type Metal Oxide Semiconductor (PMOS), it is desirable to reduce the threshold voltages of both NMOS and PMOS devices as greatly as possible while maintaining the absolute values thereof substantially equal to each other.

At present, the methods for optimizing threshold voltage characteristics of CMOS devices comprise utilization of metal gate materials having different band-edge work functions, introduction of a high-k dielectric cap layer into a gate stack so as to generate interface dipoles, and the like. However, due to phenomena such as the Fermi level pining effect and the flat band voltage ($_{Vfb}$) roll-off effect, the adjustment to the threshold voltages of the NMOS and PMOS devices by the conventional ways is limited.

Therefore, there is a need for a novel gate stack configuration and a process for manufacturing the same.

SUMMARY OF THE INVENTION

Problems to be Solved

In view of the above, it is an object of the present invention to provide a CMOSFET device with a threshold voltage controlled by means of its gate stack configuration and a method of fabricating the same, where very thin metal layers are deposited between high-k gate dielectric layers in NMOS and PMOS regions respectively, such that a flat band voltage of the device is adjusted by means of positive or negative charges generated by the very thin metal layers inside the high-k gate dielectric layers as well as interface dipoles caused by thermal diffusion of the metal atoms, and thus the threshold voltage of the device is controlled.

Means Adopted to Solve the Problem

In order to achieve the above object, according to an aspect of the invention, there is provided a CMOSFET device with a threshold voltage controlled by means of its gate stack configuration, comprising: a semiconductor substrate, for example, silicon substrate; an interface layer of oxide or nitride, such as SiO$_2$, grown on the semiconductor substrate; a first high-k gate dielectric layer deposited on the interface layer; a first metal layer deposited on the first high-k gate dielectric layer; a second high-k gate dielectric layer deposited on the first metal layer; and a gate electrode layer deposited on the second high-k gate dielectric layer.

Preferably, the interface layer has a thickness of about 0.3-1 nm.

Preferably, the first metal layer is deposited between two or more high-k gate dielectric layers of the same or different types by means of physical deposition, chemical vapor deposition, or atom layer deposition.

Preferably, for a NMOS device and a PMOS device, the materials for the very thin metal layer are different. Specifically, for the NMOS device, the materials for the to first metal layer comprises any one of a metal Mg and rare earth metals Y, La, Dy, Sc and Gd, and for the PMOS device, the materials for the first metal layer comprises any one of metals Al, Zr, Ti, Be and Hf.

Preferably, the first high-k gate dielectric layer comprises one or more high-k gate dielectric layers, and the second high-k gate dielectric layer comprises one or more high-k gate dielectric layers.

Preferably, the gate electrode layer is formed in a one-layer or multi-layer configuration, and comprises at least one of TiN, TaN, MoN, HfN, TaAlN, TiAlN, MoAlN, HfAlN, TaYbN, TaErN, TaTbN, TaC, HfC, TaSIC, HfSiC, Pt, Ru, Ir, W, Mo, Re, RuO$_x$, RuTa$_x$, HfRu$_x$, poly-silicon and metal silicides, or any combination thereof.

Preferably, the first/second high-k gate dielectric layer comprises at least one of HfO$_2$, HfSiO$_x$, HfZrO$_x$, HfON, HfSiON, HfAlO$_x$, Al$_2$O$_3$, ZrO$_2$, ZrSiO$_x$, Ta$_2$O$_5$, La$_2$O$_3$, HfLaO$_x$, LaAlO$_x$, and LaSiO$_x$, or at least one of nitrides and oxynitrides of at least one of those materials, oxides and nitrides of other rare earth elements, SiN$_x$, and SiON or any combination thereof.

To achieve the above object, according to another aspect of the invention, there is provided a method of fabricating a CMOSFET device with a threshold voltage controlled by means of its gate stack configuration, comprising: growing an interface layer on a semiconductor substrate; depositing a first high-k gate dielectric layer on the interface layer; depositing a first metal layer on the first high-k gate dielectric layer to form a structure of the first high-k gate dielectric layer and the first metal layer; depositing a second high-k gate dielectric layer on the structure of the first high-k gate dielectric layer and the first metal layer to form a stacked structure of the first high-k gate dielectric layer, the first metal layer and the second high-k gate dielectric layer; depositing a gate electrode layer on the stacked structure of the first high-k gate dielectric layer, the first metal layer and the second high-k gate dielectric layer, so as to form a gate stack; and further completing the CMOSFET device based on the gate stack.

Preferably, in the step of growing the interface layer on the semiconductor substrate, the interface layer is grown to a thickness of about 0.3-1 nm.

Preferably, in the step of depositing the first metal layer on the first high-k gate dielectric layer, the first metal layer is deposited between two or more high-k gate dielectric layers of the same or different types by means of physical deposition, chemical vapor deposition, or atom layer deposition.

Preferably, for a NMOS device and a PMOS device, the materials for the first metal layer are different. Specifically, for the NMOS device, the materials for the first metal layer comprises any one of a metal Mg and rare earth metals Y, La, Dy, Sc and Gd, and for the PMOS device, the materials for the first metal layer comprises any one of metals Al, Zr, Ti, Be and Hf.

Preferably, the first high-k gate dielectric layer comprises one or more high-k gate dielectric layers, and the second high-k gate dielectric layer comprises one or more high-k gate dielectric layers.

Preferably, in the step of depositing the metal gate electrode layer on the stacked structure of the first high-k gate dielectric layer, the first metal layer and the second high-k gate dielectric layer, the metal gate electrode layer is formed in a one-layer or multi-layer configuration, and comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon and metal silicides, or any combination thereof.

Preferably, the first/second high-k gate dielectric layer comprises at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, and $LaSiO_x$, or at least one of nitrides and oxynitrides of at least one of those materials, oxides and nitrides of other rare earth elements, $SiN_x$, and SiON or any combination thereof.

Advantageous Effects

According to the present invention, a CMOSFET device with a threshold voltage controlled by means of its gate stack configuration and a method of fabricating the same are provided, where very thin metal layers are deposited between high-k gate dielectric layers in NMOS and PMOS regions respectively, such that a flat band voltage of the device is adjusted by means of positive or negative charges generated by the very thin metal layers inside the high-k gate dielectric layers, and thus the threshold voltage of the device is controlled. According to the present invention, it is possible not only to enhance interface dipoles between the high-k gate dielectric layers and the $SiO_2$ interface layer in the CMOS device, but also to well control types and amounts of the fixed charges inside the high-k gate dielectric layers, so as to effectively control the threshold voltage of the device.

DETAILED DESCRIPTION OF PREFERRED EMBODIMENTS

To make the objects, features, and advantages of the present invention more is apparent, the present invention is described in detail in conjunction with embodiments thereof while referring to attached drawings. It is to be noted that the drawings are just illustrative and are not drawn to scale, wherein some details may be omitted for the purpose of clarity.

According to the present invention, a CMOSFET device with a threshold voltage controlled by means of its gate stack configuration and a method of fabricating the same are provided, wherein very thin metal layers are deposited between high-k gate dielectric layers in NMOS and PMOS regions respectively, such that a flat band voltage of the device is adjusted by means of positive or negative charges generated by the very thin metal layers inside the high-k gate dielectric layers, and thus the threshold voltage of the device is controlled. Thus, it is possible not only to enhance interface dipoles between the high-k dielectric layers and a $SiO_2$ interface layer, but also to well control types and amounts of fixed charges inside the high-k gate dielectric layers, so as to effectively control the threshold voltage of the device.

Figure 1:
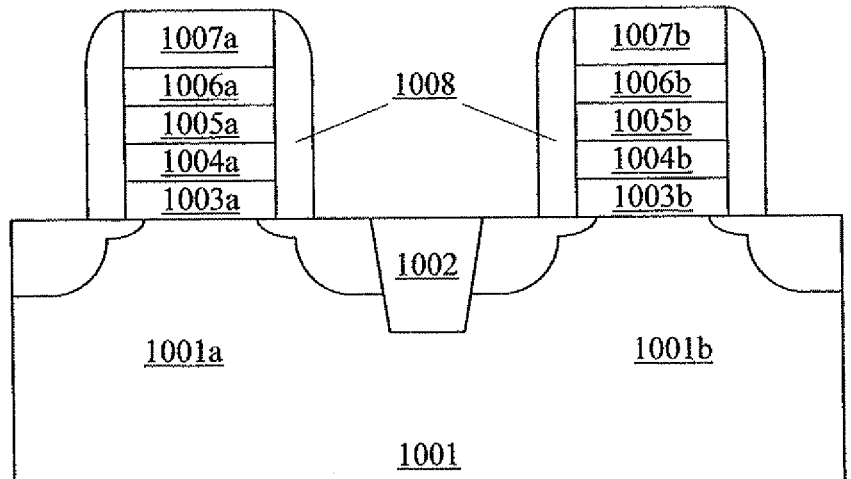
FIG. 1 is a schematic diagram showing a CMOSFET device with a threshold voltage controlled by means of its gate stack configuration according to an embodiment of the present invention.

FIG. 1 is a schematic diagram showing a CMOSFET device with a threshold voltage controlled by means of its gate stack configuration according to an embodiment of the present invention. In FIG. 1, two MOS structures are shown on a semiconductor substrate 1001 (for example, silicon substrate). Specifically, the semiconductor substrate 1001 comprises, for example, a first region 1001a and a second region 1001b for formation of a PMOS and an NMOS respectively, which are preferably separated from each other by a Shallow Trench Isolation (STI) 1002. As shown in FIG. 1, the CMOSFET device according to this embodiment comprises:

the semiconductor substrate 1001, for example, a silicon substrate;

interface layers 1003a and 1003b grown on the semiconductor substrate 1001, which comprise an oxide or a nitride such as $SiO_2$, for example;

first high-k gate dielectric layers 1004a and 1004b deposited respectively on the interface layers;

very thin first metal layers 1005a and 1005b deposited respectively on the first high-k gate dielectric layers;

second high-k gate dielectric layers 1006a and 1006b deposited respectively on the first metal layers; and gate electrode layers 1007a and 1007b deposited respectively on the second high-k gate dielectric layers.

Preferably, the interface layers 1003a and 1003b have a thickness of 0.3-1 nm.

The first metal layers 1005a and 1005b are deposited between two or more high-k gate dielectric layers of same or different types. That is, the first high-k dielectric layer 1004a and 1004b may comprise one or more high-k gate dielectric layers, and likewise, the second high-k dielectric layer 1006a and 1006b may comprise one or more high-k gate dielectric layers. The deposition thereof comprises, but not limited to, physical deposition, chemical vapor deposition, or atom layer deposition. The first metal layers comprise different materials for NMOS and PMOS devices respectively. For example, for the NMOS device, the material for the first metal layer may comprise any one of a metal Mg, rare earth metals Y, La, Dy, Sc and Gd; and for the PMOS device, the material for the first metal layer may comprise any one of metals Al, Zr, Ti, Be and Hf. The high-k gate dielectric layers may be of a one-layer or multi-layer configuration.

The gate electrode layers 1007a and 1007b may be of a one-layer or multi-layer configuration, and may comprise at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon, and metal silicides, or any combination thereof.

The first/second high-k gate dielectric layers may comprise at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, and $LaSiO_x$, or at least one of nitrides and oxynitrides of at least one of those materials, oxides and nitrides of other rare earth elements, $SiN_x$, and SiON or any combination thereof.

Figure 2:
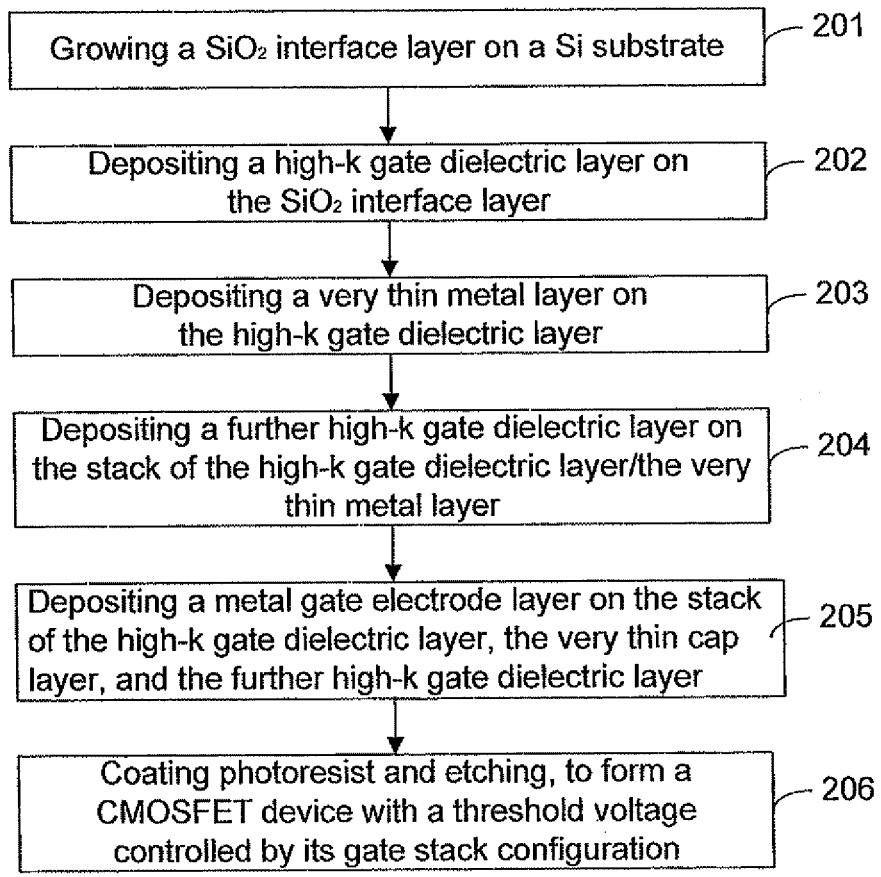
FIG. 2 is a schematic flow chart showing a method of fabricating a CMOSFET device with a threshold voltage controlled by means of its gate stack configuration according to an embodiment of the present invention.

FIG. 2 is a schematic flow chart showing a method of fabricating a CMOSFET device with a threshold voltage controlled by means of its gate stack configuration according to an embodiment of the present invention. As shown in FIG. 2, the method comprises:

step 201: growing an interface layer on a semiconductor substrate;

step 202: depositing a high-k gate dielectric layer on the interface layer;

step 203: depositing a very thin metal layer on the high-k gate dielectric layer to form a structure of the high-k dielectric layer and the very thin metal layer;

step 204: depositing a further high-k gate dielectric layer on the structure of the high-k dielectric layer and the very thin metal layer to form a stacked structure of the high-k dielectric layer, the very thin metal layer and the further high-k gate dielectric layer;

step 205: depositing a gate electrode layer on the stacked structure of the high-k dielectric layer, the very thin metal layer and the further high-k gate dielectric layer to form a gate stack; and step 206: coating photoresist and etching to further complete the CMOSFET device with the threshold voltage controlled by the gate stack configuration based on the gate stack.

Hereinafter, the method flow will be described in detail with reference to a particular example.

FIGS. 3-8 are schematic section views showing respective processes of fabricating a CMOSFET device with a threshold voltage controlled by means of its gate stack according to an embodiment of the present invention.

Figure 3:
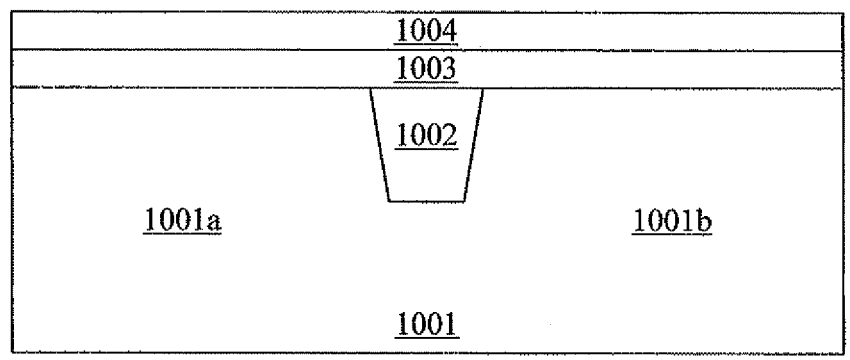
FIGS. 3-8 are schematic section views showing respective processes of fabricating a CMOSFET device with a threshold voltage controlled by means of its gate stack configuration according to an embodiment of the present invention.

As shown in FIG. 3, on a prepared semiconductor substrate 1001 (for example, a silicon substrate), an interface layer 1003 (for example, $SiO_2$) with a thickness of about 0.5 nm and a first high-k gate dielectric layer 1004 (for example, $HfO_2$) with a thickness of about 3 nm are grown. Here, for example, the semiconductor substrate 1001 comprises a first region 1001a and a second region 1001b for PMOS and NMOS devices respectively, which preferably are separated from each other by means of a Shallow Trench Isolation (STI) 1002.

Figure 4:
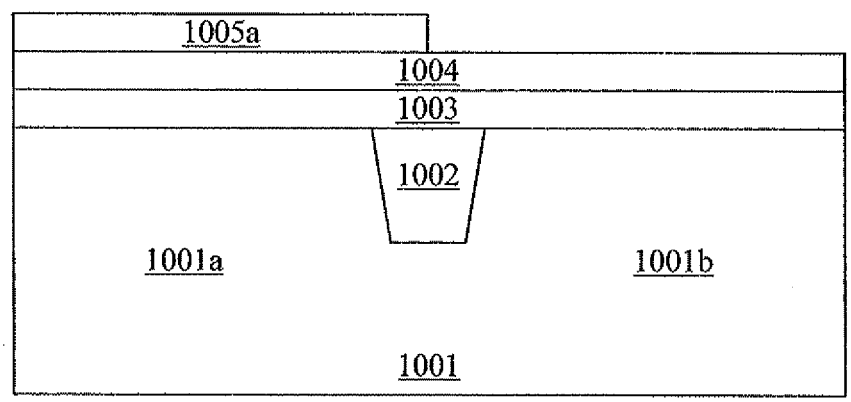
Figure 5:
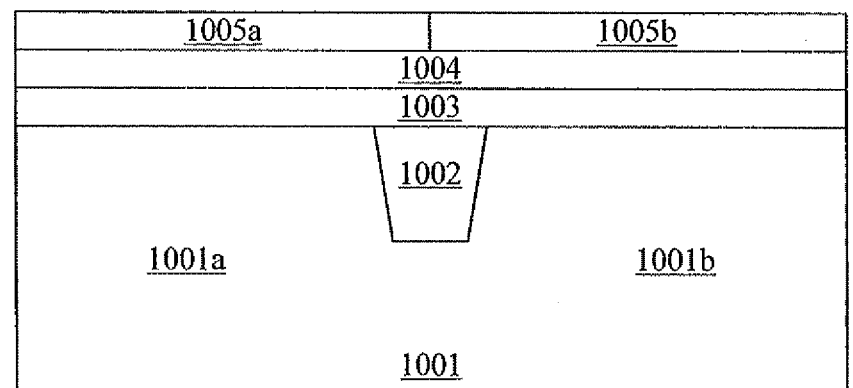

Next, as shown in FIG. 4, a very thin metal layer 1005a having a thickness of about 0.3-1 nm is deposited on the structure of $HfO_2/SiO_2$ in the first region 1001a. The very thin metal layer 1005a may be continuous or discontinuous. For example, this may be achieved by depositing a metal layer on the whole surface of the substrate, and then patterning the metal layer by means of photolithograph, for example. In the case where the first region 1001a is provided for formation of the PMOS, the metal layer 1005a may comprise any one of metal Al, Zr, Ti, Be and Hf. Similarly, as shown in FIG. 5, a very thin metal layer 1005b having a thickness of about 0.3-1 nm is deposited on the structure of $HfO_2/SiO_2$ in the second region 1001b. The very thin metal layer 1005b may be continuous or discontinuous. In the case where the second region 1001b is provided for formation of the NMOS, the metal layer 1005b may comprise any one of a metal Mg and rare earth metals Y, La, Dy, Sc and Gd.

Figure 6:
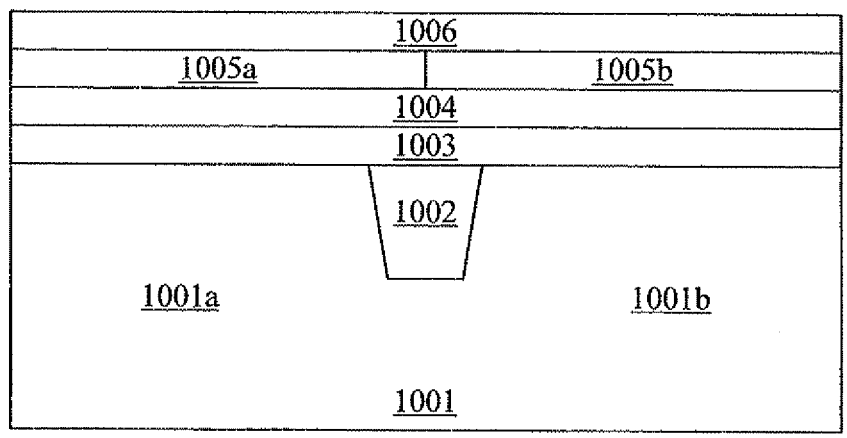

Then, as shown in FIG. 6, on the whole surface of the structure shown in FIG. 5, specifically, on the very thin metal layers 1005a and 1005b in the first and second regions, a second high-k gate dielectric layer 1006 is deposited. Here it is to be noted that the first high-k gate dielectric layer 1004 and the second high-k gate dielectric layer 1006 may be of the same or different materials.

Figure 7:
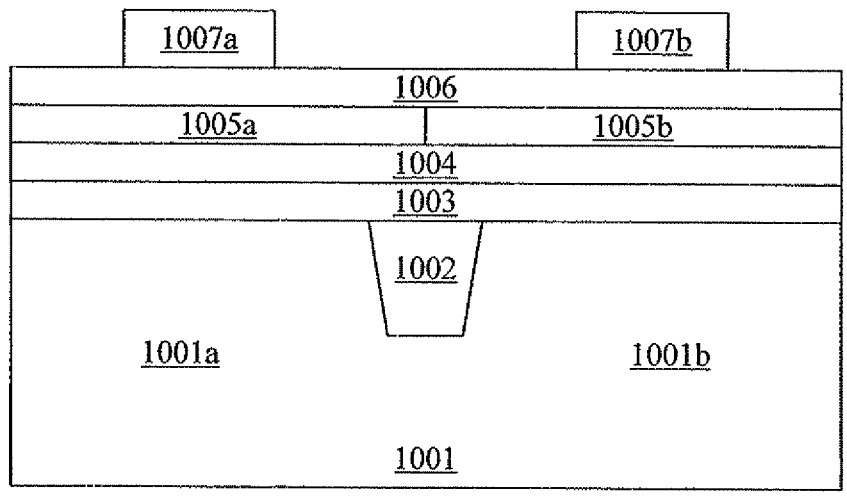

Next, as shown in FIG. 7, on the second high-k gate dielectric layer 1006, gate is electrode layers 1007a and 1007b are deposited at the positions corresponding to the first region 1001a and the second region 1001b. The gate electrode layers 1007a and 1007b may be of the same or different materials. For example, the gate electrode layers 1007a and 1007b may be formed by depositing a metal layer and then patterning the metal layer by means of photolithograph, for example.

Figure 8:
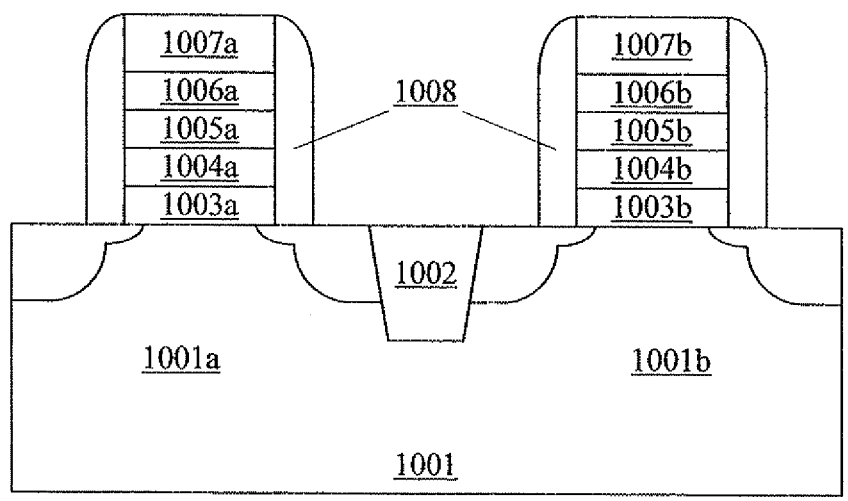

Finally, as shown in FIG. 8, processes such as photoresist coating, patterning and etching are preformed on the first and second regions respectively to form gate stacks, and then processes such as spacer formation and ion implantation are preformed to complete the CMOSFET device. In FIG. 8, spacers 1008 are also shown on both sides of the gate stacks. Other processes for completing the CMOSFET devices based on the gate stacks are well known in the art. Those skilled in the art may conceive various ways to carry out those processes, which are omitted here.

Though the embodiment where both of the PMOS and NMOS are formed is described above, it is to be understood by those skilled in the art that only one MOS or a plurality of MOS's may be formed.

The above described embodiments are provided to illustrate the objects, features and advantageous effects of the present invention in detail. However, it is to be understood that those embodiments are just for illustrative purpose, rather than limiting the invention. Any changes, equivalents and modifications to those embodiments within the spirit and principle of the invention all fall into the scope of the invention.

What is claimed is:

1. A Complementary Metal-Oxide-Semiconductor Field Effect Transistor (CMOSFET) device, comprising:
a semiconductor substrate; an interface layer grown on the semiconductor substrate;
a first high-k gate dielectric layer deposited on the interface layer;
a metal layer deposited on the first high-k gate dielectric layer; a second high-k gate dielectric layer deposited on the metal layer; and
a gate electrode layer deposited on the second high-k gate dielectric layer;
wherein the metal lager is configured to generate positive or negative charges in the high- k Rate dielectric layers and also interface dipoles between the first high-k gate dielectric lager and interface layer; and
wherein for a N-type Metal Oxide Semiconductor (NMOS) device and a P-type Metal Oxide Semiconductor (PMOS) device, the materials for the metal layer are different, wherein for the NMOS device, the materials for the metal layer comprises any one of rare earth metal Y, La, Dy and Gd, and for the PMOS device, the materials for the metal layer comprises any one of metals Al, Mg and Hf.

2. The CMOSFET device according to claim 1, wherein the interface layer is formed of $SiO_2$, and has a thickness of about 0.3-1 nm.

3. The CMOSFET device according to claim 1, wherein the metal layer has a thickness of about 0.3-1 nm, and deposition of the metal layer comprises one of physical deposition, chemical vapor deposition, and atom layer deposition.

4. The CMOSFET device according to claim 1, wherein the first high-k gate dielectric layer comprises one or more high-k gate dielectric layers, and the second high-k gate dielectric layer comprises one or more high-k gate dielectric layers.

5. The CMOSFET device according to claim 1, wherein the gate electrode layer is formed in a one-layer or multi-layer configuration, and comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon and metal silicides, or any combination thereof.

6. The CMOSFET device according to claim 1, wherein the first/second high-k gate dielectric layer comprises at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, and $LaSiO_x$, or at least one of nitrides and oxynitrides of at least one of those materials, oxides and nitrides of other rare earth elements, $SiN_x$, and SiON or any combination thereof.

7. A method of fabricating a Complementary Metal-Oxide-Semiconductor Field Effect Transistor (CMOSFET) device, comprising:
 growing an interface layer on a semiconductor substrate;
 depositing a first high-k gate dielectric layer, a metal layer, and a second high-k Rate dielectric layer sequentially on the interface layer to form a stacked structure of the first high-k gate dielectric layer, the metal lager and the second high-k gate dielectric lager, so that the metal layer generates positive or negative charges in the high-k gate dielectric layers and also interface dipoles between the first high-k gate dielectric layer and interface layer
 depositing a gate electrode layer on the stacked structure of the first high-k gate dielectric layer, the metal layer and the second high-k gate dielectric layer to form a gate stack;
 further completing the CMOSFET device based on the gate stack; and
 wherein for a N-type Metal Oxide Semiconductor (NMOS) device and a P-type Metal Oxide Semiconductor (PMOS) device, the materials for the metal layer are different, wherein for the NMOS device, the materials for the metal layer comprises any one of rare earth metal Y, La, D and Gd, and for the PMOS device, the materials for the metal layer comprises any one of metals Al, Mg and Hf.

8. The method of fabricating the CMOSFET device according to claim 7, wherein in the step of growing the interface layer on the semiconductor substrate, the interface layer is grown to have a thickness of about 0.3-1 nm.

9. The method of fabricating the CMOSFET device according to claim 7, wherein in the step of depositing the metal layer on the first high-k gate dielectric layer, the depositing comprises one of physical deposition, chemical vapor deposition, and atom layer deposition.

10. The method of fabricating the CMOSFET device according to claim 7, wherein the first high-k gate dielectric layer comprises one or more high-k gate dielectric layers, and the second high-k gate dielectric layer comprises one or more high-k gate dielectric layers.

11. The method of fabricating the CMOSFET device according to claim 7, wherein in the step of depositing the gate electrode layer on the stacked structure of the first high-k gate dielectric layer, the metal layer and the second high-k gate dielectric layer, the gate electrode layer is formed in a one-layer or multi-layer configuration, and comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon and metal silicides, or any combination thereof.

12. The method of fabricating the CMOSFET device according to claim 7, wherein the first/second high-k gate dielectric layer comprises at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, and $LaSiO_x$, or at least one of nitrides and oxynitrides of at least one of those materials, oxides and nitrides of other rare earth elements, $SiN_x$, and SiON or any combination thereof.

* * * * *